(12) United States Patent
Sakai

(10) Patent No.: US 6,812,692 B2
(45) Date of Patent: Nov. 2, 2004

(54) INSPECTION TERMINAL FOR INSPECTING ELECTRONIC CHIP COMPONENT, AND INSPECTION METHOD AND INSPECTION APPARATUS USING THE SAME

(75) Inventor: Satoki Sakai, Takefu (JP)

(73) Assignee: Murata Manufacturing Co., LTD, Kyoto (JP)

(*) Notice: Subject to any disclaimer, the term of this patent is extended or adjusted under 35 U.S.C. 154(b) by 0 days.

(21) Appl. No.: 10/215,025

(22) Filed: Aug. 9, 2002

(65) Prior Publication Data
US 2003/0042924 A1 Mar. 6, 2003

(30) Foreign Application Priority Data
Aug. 30, 2001 (JP) ........................................ 2001-261248

(51) Int. Cl.[7] .............................................. G01R 31/02
(52) U.S. Cl. ..................................... 324/158.1; 324/754
(58) Field of Search ................................ 324/754, 755, 324/757, 761, 762, 73.1, 158.1; 209/573, 574, 575

(56) References Cited

U.S. PATENT DOCUMENTS 5,720,098 A * 2/1998 Kister .......................... 29/825

* cited by examiner

Primary Examiner—Minh Tang
Assistant Examiner—Russell M. Kobert
(74) Attorney, Agent, or Firm—Keating & Bennett LLP

(57) ABSTRACT

An inspection terminal for accurately measuring a characteristic of an electronic chip component without causing an inner electrode layer constituting an external electrode of the electronic chip component to be exposed to the outside, an inspection method, and an inspection apparatus using the same, involves storing an electronic chip component in a storing portion of a turntable and sucking the electronic chip component by a sucking portion provided in a side guard. A linear edge portion of the inspection terminal is pressed from the bottom so as to abut against the external electrode of the electronic chip component. The linear edge portion is arranged to have an obtuse angle and is brought into contact with the external electrode such that the edge portion lies substantially parallel to the longitudinal direction of the external electrode.

4 Claims, 4 Drawing Sheets

Fig. 4
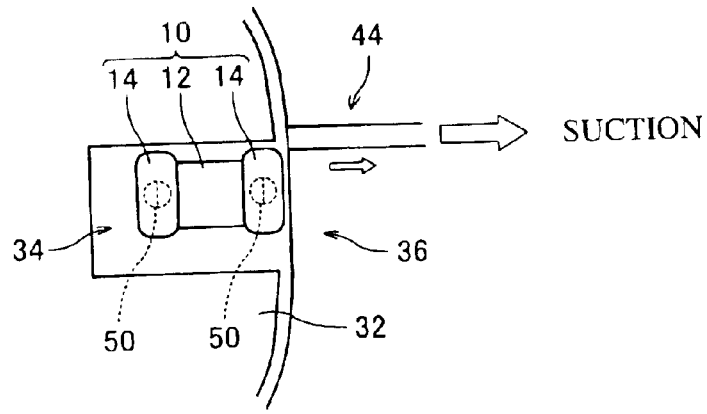
Fig. 5
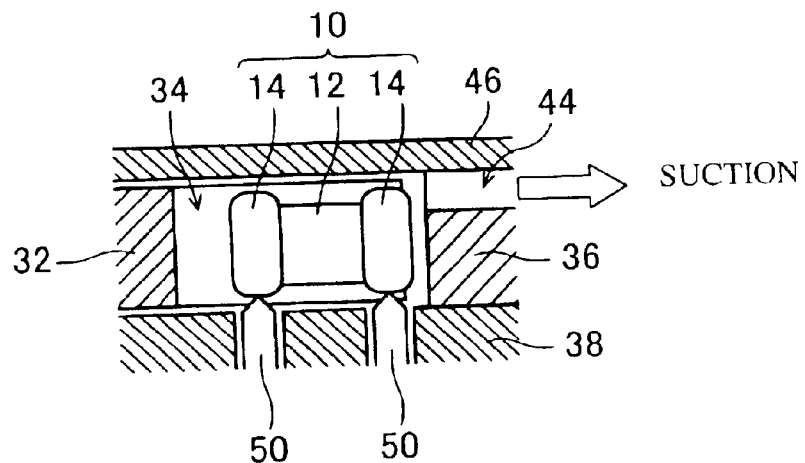
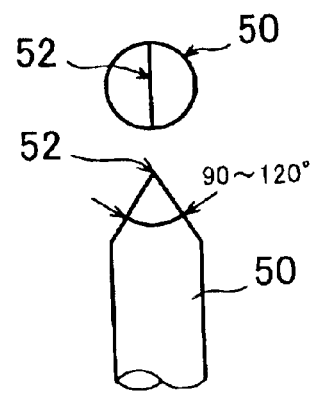
Fig. 6A
Fig. 6B

US 6,812,692 B2

INSPECTION TERMINAL FOR INSPECTING ELECTRONIC CHIP COMPONENT, AND INSPECTION METHOD AND INSPECTION APPARATUS USING THE SAME

BACKGROUND OF THE INVENTION

1. Field of the Invention

The present invention relates to inspection terminals for inspecting electronic chip components, and inspection methods and inspection apparatuses using the same, and more particularly, the present invention relates to an inspection terminal for inspecting an electronic chip component by bringing the inspection terminal into contact with, for example, an external electrode of the electronic chip component, and an inspection method and an inspection apparatus for inspecting the electronic chip component using the same.

2. Description of the Related Art

FIG. 9 is an illustration of an example inspection apparatus for inspecting an electronic chip component using a known inspection terminal, disclosed in Japanese Unexamined Patent Application Publication No. 10-19949. An inspection apparatus 1 includes a turntable 2 acting as a carrier unit for carrying electronic chip components 5. The turntable 2 has a plurality of depressions arranged around the periphery thereof, each defining a storing portion 3 which stores one electronic chip component 5. The electronic chip component 5 is carried around the circumference of the turntable 2 by rotating the turntable 2.

Along the carrying path of the turntable 2, the inspection apparatus 1 has an inserter unit 6 for inserting the electronic chip component 5 into the storing portion 3, an inspection unit 7 for measuring a characteristic of the component 5, and a sorter unit 8 for sorting the component 5 based on the measured characteristics of the component 5. The turntable 2 carries the electronic chip components 5 stored in the storing portions 3 from the inserter unit 6 to the inspection unit 7. As shown in FIGS. 10A and 10B, at the inspection unit 7, an inspection terminal 9 is brought into contact with a side surface of an external electrode 5a of the electronic chip component 5.

The inspection terminal 9 is cylindrical and has a linear edge portion 9a at the end thereof. The edge portion 9a has an acute angle, generally about 80 degrees. The linear portion of the edge portion 9a is brought into contact with the external electrode 5a in the widthwise direction of the external electrode 5a, that is, so as to be substantially parallel to the longitudinal direction of the entire electronic chip component 5, as shown in FIGS. 10A and 10B. The inspection terminal 9 is connected to the inspection apparatus 1 and serves as a measuring terminal for measuring a characteristic of the electronic chip component 5. For example, when the electronic chip component 5 is a chip-type capacitor, the capacitance, the insulating resistance, and so forth thereof are measured.

The external electrode 5a of the electronic chip component 5 has a multilayer structure. First, the electronic chip component 5 has an electrode, made from a metal such as Ag or Cu, baked at the end of a substrate thereof. The electronic chip component 5 also has a Ni-plated layer formed thereon for preventing electrode leaching causing the electrode to elute into a solder member during soldering, and further has a Sn-plated layer formed on the Ni-plated layer for improving solderability.

The Sn-plated layer is likely to be oxidized and accordingly has an oxide film formed on the surface thereof, sometimes causing inaccurate measurement of the characteristic. This problem however can be solved by providing the inspection terminal 9 with the edge portion 9a. That is, the edge portion 9a breaks the oxide film on the surface of the external electrode 5a and cuts into the external electrode 5a, leading to accurate measurement of the characteristic. Even when the inspection terminal 9 has dirt accumulated on the surface thereof, the dirt is removed since the surface of the inspection terminal 9a rubs against the external electrode 5a when the inspection terminal 9 cuts into the external electrode 5a. Accordingly, an incorrect measurement caused by the dirt can be prevented, since the inspection terminal 9 has little dirt on the surface of the edge portion 9a which has cut into the external electrode 5a.

In addition, even when the electronic chip component 5 moves inside the storing portion 3, the inspection terminal 9 can be reliably brought into contact with the external electrode 5a by bringing the linear portion of the edge portion 9a into contact with the external electrode 5a so as to be substantially parallel to the widthwise direction of the external electrode 5a. In other words, since the edge portion 9a of the inspection terminal 9 has a linear shape, at least one portion of the edge portion 9a comes into contact with the external electrode 5a even when the electronic chip component 5 moves in the widthwise direction of the external electrode 5a, i.e., in the longitudinal direction of the entire electronic chip component 5. Furthermore, since the entire external electrode 5a is not totally out of contact with the inspection terminal 9 even when the electronic chip component 5 moves in the longitudinal direction of the external electrode 5a, i.e., in the widthwise direction of the entire electronic chip component 5, the inspection terminal 9 can be brought into contact with the external electrode 5a.

However, the edge portion of the above-described inspection terminal sometimes passes through the Sn-plated layer and reaches the Ni-plated layer since the edge portion has an acute angle. If an inner electrode layer such as the Ni-plated layer is exposed to the outside as described above, the solderability may deteriorate because of a chemical reaction of the exposed inner electrode layer when the electronic chip component is soldered onto a circuit board, thereby causing a risk of poor mounting.

Also, the external electrode of the electronic chip component is rounded off in the widthwise direction thereof as shown in FIG. 10A because of its short width. As a result, the length of the contact area between the external electrode and the inspection terminal is short, and thus, the pressing force per unit length caused by the inspection terminal increases, thereby leading to a large cut-in depth of the edge portion and consequently causing the inner electrode layer to be easily exposed to the outside.

SUMMARY OF THE INVENTION

In order to overcome the problems described above, preferred embodiments of the present invention provide an inspection terminal for inspecting an electronic chip component by accurately measuring the characteristic of the component without exposing an inner electrode layer constituting an external electrode of the component to the outside, and an inspection method using such an inspection terminal.

Also, preferred embodiments of the present invention provide an inspection apparatus which allows the inspection terminal to come into reliable contact with the external electrode of the electronic chip component by using the above-described inspection terminal and inspection method.

According to a preferred embodiment of the present invention, an inspection terminal, which contacts an external electrode of an electronic chip component for measuring a characteristic of the electronic chip component, includes a liner edge portion disposed at the end of the terminal, wherein the edge portion has an obtuse angle.

In such an inspection terminal, the edge portion has an angle preferably greater than about 90° and equal to or smaller than about 120°.

According to another preferred embodiment of the present invention, an inspection method for inspecting an electronic chip component includes the steps of preparing the inspection terminal according to the preferred embodiment described above, bringing the linear edge portion into contact with an external electrode of the electronic chip component so as to be substantially parallel to the longitudinal direction of the external electrode, and inspecting the electronic chip component in this contacting state.

According to yet another preferred embodiment of the present invention, an inspection apparatus for inspecting an electronic chip component includes a carrier unit and a plurality of storing portions located in the carrier unit, each storing and carrying one electronic chip component, wherein the electronic chip component is sucked into the storing portion in a predetermined direction so as to be positioned and then inspected by bringing the inspection terminal according to preferred embodiments described above into contact with an external electrode of the electronic chip component.

Further, the inspection apparatus according to a preferred embodiment of the present invention includes a carrier unit and a plurality of storing portions located in the carrier unit, each storing and carrying one electronic chip component, wherein the electronic chip component is sucked into the storing portion in a predetermined direction so as to be positioned and then is inspected by using the inspection method according to the preferred embodiment described above.

In such inspection apparatuses, the electronic chip component may further be sorted on the basis of the inspected result obtained by inspecting the electronic chip component by bringing the inspection terminal into contact with the external electrode.

Since the inspection terminal has a linear edge portion disposed at the end thereof such that the linear edge portion has an obtuse angle, the edge portion of the inspection terminal does not cut excessively deep into the external electrode of the electronic chip component, and cuts in to the external level to a level sufficiently deep to break the surface of the external electrode.

The angle of the edge portion is preferably greater than about 90° and equal to or smaller about 120° so that the edge portion of the inspection terminal appropriately cuts into the external electrode of the electronic chip component.

With the above-described inspection terminal, substantially the entire length of the linear edge portion can be brought into contact with the external electrode of the electronic chip component by bringing the linear edge portion into contact with the external electrode so as to be substantially parallel to the longitudinal direction of the external electrode, thereby leading to a reduced pressing force per unit length and thus a reduced cut-in depth of the edge portion into the external electrode. As a result, the characteristic of the electronic chip component can be measured without causing the inner electrode layer to be exposed to the outside.

Also, with the above-described inspection terminal and inspection method, the external electrode can be arranged substantially in a fixed position by storing the electronic chip component in one of the storing portions located in the carrying unit of the inspection apparatus and by positioning the electronic chip component in the storing portion by sucking it in a predetermined direction, thereby allowing the inspection terminal to come into reliable contact with the external electrode.

By sorting the electronic chip component on the basis of an accurate inspection result obtained in an above-described manner, defective products can be reliably removed.

According to preferred embodiments of the present invention, the edge portion of the inspection terminal properly cuts into the external electrode of the electronic chip component, thereby accurately measuring the characteristic of the component without being affected by an oxide film on the surface of the external electrode or dirt on the surface of the inspection terminal. In addition, by bringing the linear edge portion into contact with the external electrode so as to be substantially parallel to the longitudinal direction of the external electrode, the contact length between the edge portion and the external electrode increases, and also the cut-in depth of the edge portion cutting into the external electrode can be adjusted.

Furthermore, by sucking the electronic chip component in a predetermined direction so as to be positioned at a predetermined position in the storing portion of the carrier unit, the position of the external electrode can be determined, thereby allowing the inspection terminal to be pressed to reliably abut against the external electrode. As a result, the above-described inspection apparatus achieves a reliable and accurate measurement of the characteristic of the electronic chip component.

The above described and other features, elements, characteristics and advantages of the present invention will become clearer from the following detailed description of preferred embodiments of the present invention with reference to the accompanying drawings.

BRIEF DESCRIPTION OF THE DRAWINGS

FIG. 4 is an overhead view illustrating the inside of a storing portion of an inspection unit of the inspection apparatus shown in FIG. 3;

FIG. 5 is a side view illustrating the inside of the storing portion shown in FIG. 4;

FIGS. 6A and 6B are a plan view and a side view, respectively, of the inspection terminal according to a preferred embodiment of the present invention;

DETAILED DESCRIPTION OF PREFERRED EMBODIMENTS

Figure 1:
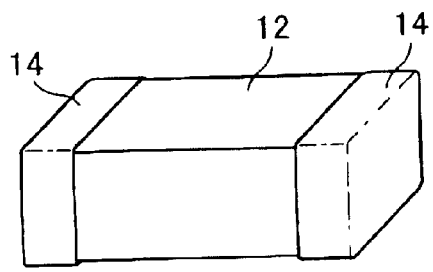
FIG. 1 is a schematic view of an example electronic chip component, a characteristic of which is measured by an inspection terminal according to a preferred embodiment of the present invention.

The present invention relates to an inspection terminal for measuring a characteristic of an electronic chip component 10 shown in FIG. 1, and an inspection method and an inspection apparatus using the same. The electronic chip component 10 is, for example, a laminated ceramic capacitor, although it may be another type of electronic chip component.

Figure 2:
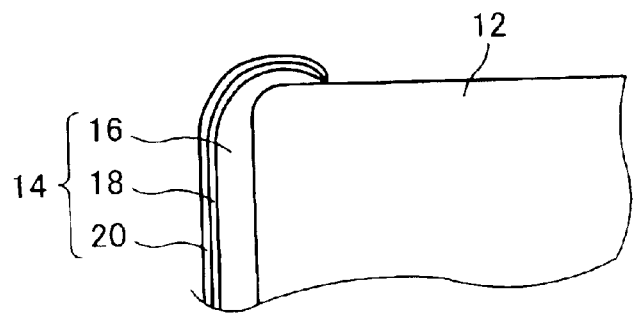
FIG. 2 is an illustration of the structure of an external electrode of the electronic chip component shown in FIG. 1.

The electronic chip component 10 includes a substrate 12. When the electronic chip component 10 is, for example, a laminated ceramic capacitor, the substrate 12 has a plurality of dielectric layers and a plurality of internal electrodes laminated therein, and the adjacent internal electrodes are alternately lead out at the opposing ends of the substrate 12. The substrate 12 has a pair of external electrodes 14 at the opposing ends thereof. Each external electrode 14 preferably has, for example, a three-layered structure as shown in FIG. 2. First, the external electrode 14 has a baked electrode 16 made of a conductive metal such as Ag or Cu or other suitable material, then has a Ni-plated layer 18 disposed on the baked electrode 16 in order to prevent electrode leaching when soldering, and further has a Sn-plated layer 20 disposed on the Ni-plated layer 18 in order to achieve improved solderability. In such an electronic chip component 10, the external electrode 14 is rounded off in the widthwise direction thereof because of the small width of the external electrode 14, which is disposed on the corresponding side surface of the substrate 12, that is, because of the short length of the external electrode 14 in the longitudinal direction of the substrate 12.

Figure 3:
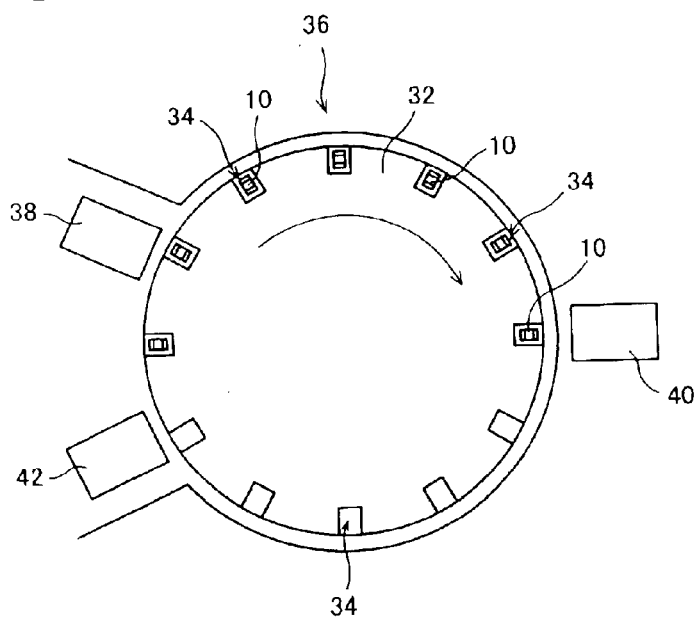
FIG. 3 is an illustration of an inspection apparatus for measuring the characteristic of the electronic chip component shown in FIG. 1 and for sorting the measured electronic chip component.

An inspection apparatus 30 shown in FIG. 3 is used in order to measure the characteristic of such electronic chip components 10 and also to sort the measured components 10. The inspection apparatus 30 includes a turntable 32 functioning as a carrier unit for carrying the electronic chip components 10. The turntable 32 has a plurality of depressions formed around the periphery thereof, each functioning as a storing portion 34 for storing one electronic chip component 10.

The turntable 32 has a side guard 36 arranged along the circumference thereof for preventing any of the electronic chip components 10 stored in the storing portions 34 from flying out when the turntable 32 is rotating. This side guard 36 can be eliminated when the electronic chip component 10 is constructed such that the electronic chip component 10 does not fly out. Although the turntable 32 has an upper cover thereabove, it is not shown in FIG. 3. With this arrangement, the storing portions 34 of the turntable 32 are enclosed by the side guard 36 and the upper cover, and the electronic chip components 10 are thus carried around the circumference of the turntable 32 by rotating the turntable 32.

Along the transport path of the turntable 32, the inspection apparatus 30 has an inserter unit 38 for inserting the electronic chip components 10 into the storing portions 34, an inspection unit 40 for measuring the characteristics of the components 10, and a sorter unit 42 for sorting the components 10 based on the measured characteristics of the components 10. The electronic chip component 10 is stored in the storing portion 34 at the inserter unit 38.

The electronic chip component 10 inserted in the storing portion is carried to the inspection unit 40 and its characteristic is measured. At the inspection unit 40, the side guard 36 has a sucking portion 44 disposed at a position thereof corresponding to a corner of the storing portion 34, as shown in FIGS. 4 and 5. The sucking portion is located, for example, close to or at the lower portion of an upper cover 46 at the corner of the corresponding storing portion 34. While being connected to a vacuum pump or the like, the sucking portion 44 sucks the electronic chip component 10 so as to position it at a predetermined position. The sucking portions 44 may be disposed in the turntable 32 side so as to suck and hold the electronic chip components 10 in the storing portions 34 of the turntable 32. In this case, the side guard 36 can be eliminated.

When the electronic chip component 10 is positioned, a pair of inspection terminals 50 protrude from a bottom 48 at positions corresponding to the pair of external electrodes 14. Each inspection terminal 50 is substantially cylindrical and has a linear edge portion 52 at the end thereof, as shown in FIGS. 6A and 6B. The edge portion 52 has an obtuse angle, preferably greater than about 90° and equal to or smaller than about 120°.

The linear portion of the edge portion 52 of the inspection terminal 50 is pressed to abut against a side surface of the corresponding external electrode 14 on the side surface of the substrate 12 such that the linear portion lies substantially parallel to the longitudinal direction of the external electrode 14, that is, in the widthwise direction of the substrate 12. The inspection terminal 50 is connected to a measurement circuit so as to measure the characteristic of the electronic chip component 10. When the characteristic of the electronic chip component 10 is measured, the turntable 32 rotates so as to carry the measured electronic chip component 10 to the sorter unit 42. The electronic chip components 10 are sorted at the sorter unit 42 on the basis of the characteristics thereof measured at the inspection unit 40 so as to remove defective products.

In such an inspection apparatus 30, since the edge portion 52 of the inspection terminal 50 is pressed to abut against the external electrode 14 of the electronic chip component 10 at the inspection unit 40, the edge portion 52 comes into contact with the external electrode 14 so as to cut into it. Since the edge portion 52 of the inspection terminal 50 cuts into the external electrode 14, even when an oxide film is formed on the Sn-plated layer 20 defining the outermost layer, the inspection terminal 50 comes into contact with the external electrode 14 by breaking the oxide film, whereby the characteristic of the electronic chip component 10 can be accurately measured.

Figure 7A:
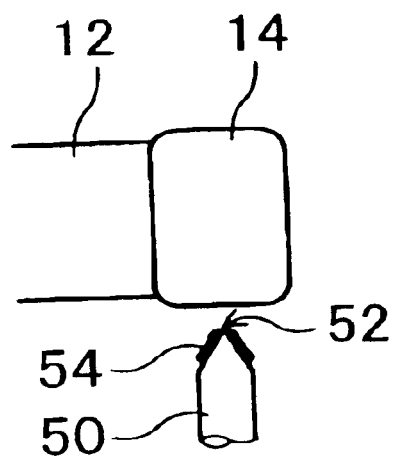
FIGS. 7A and 7B are illustrations showing the manner in which the inspection terminal shown in FIGS. 6A and 6B is pressed to abut against the external electrode of the electronic chip component.
Figure 7B:
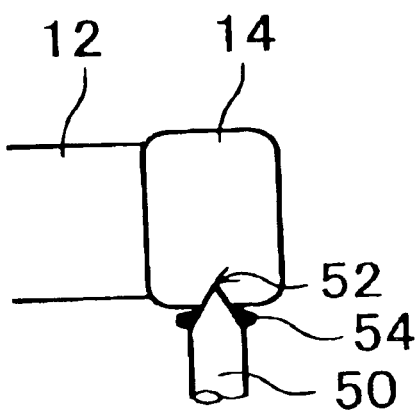

Also, in the above-described inspection terminal 50, the edge portion 52 stops in the Sn-plated layer 20 defining the outermost layer and does not reach the Ni-plated layer 18 even when the edge portion 52 cuts into the external electrode 14, since the edge portion 52 has an obtuse angle. Accordingly, the Ni-plated layer 18 is not exposed to the outside, whereby an excellent solderability is achieved when the electronic chip component 10 is mounted on a circuit board or other substrate. In addition, even when the edge portion 52 has dirt 54 accumulated on the surface thereof as shown in FIGS. 7A and 7B, the dirt 54 is removed since the edge portion 52 rubs against the external electrode 14 when the edge portion 52 cuts into the external electrode 14, thereby preventing a poor measurement caused by the dirt accumulated on the surface of the inspection terminal 50.

Figure 8A:
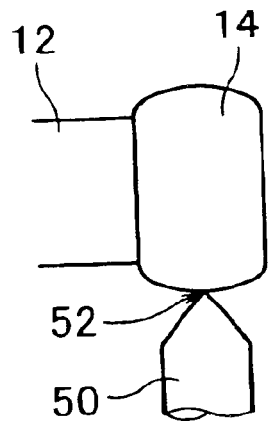
FIGS. 8A and 8B are other illustrations showing the manner in which the inspection terminal is pressed to abut against the external electrode of the electronic chip component.
Figure 8B:
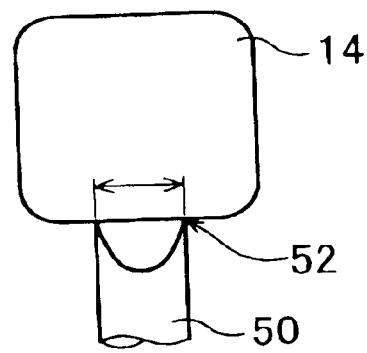
Figure 9:
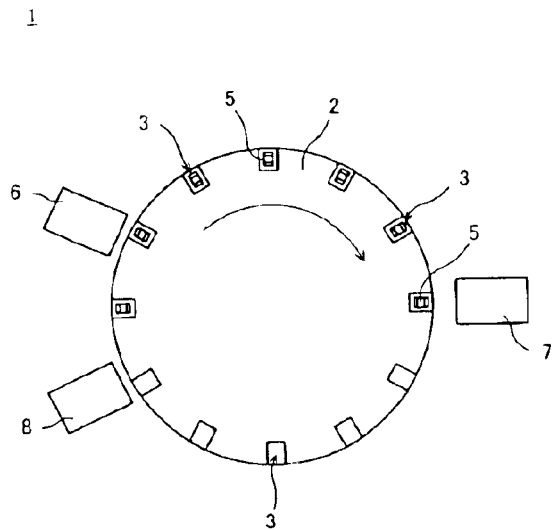
FIG. 9 is an illustration of a known inspection apparatus for inspecting electronic chip components by way of example.
Figure 10A:
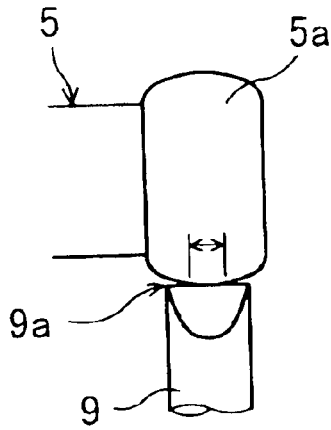
FIGS. 10A and 10B are illustrations showing the known manner in which a known inspection terminal is pressed to abut against the external electrode of the electronic chip component.
Figure 10B:
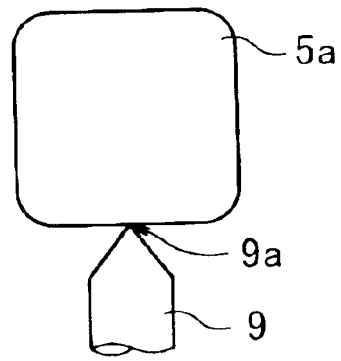

Furthermore, in the above-described inspection apparatus 30, since the linear edge portion 52 of the inspection terminal 50 is pressed to abut against the external electrode 14 such that the linear edge portion 52 lies substantially parallel to the longitudinal direction of the external electrode 14, as shown in FIGS. 8A and 8B, the edge portion 52 can be pressed to abut linearly against the external electrode 14 even when the external electrode 14 is rounded in the widthwise direction thereof, leading to a greater contact length between the edge portion 52 of the inspection terminal 50 and the external electrode 14. The above-described configuration makes the pressing force per unit length exerted on the external electrode 14 smaller and thus the cut-in depth of the edge portion 52 smaller, in comparison with a configuration in which, as shown in FIGS. 10A and 10B by way of example, a linear edge portion 9a is pressed to abut against the external electrode 5a such that the linear edge portion 9a lies substantially parallel to the widthwise direction of the external electrode 5a, thereby preventing the edge portion 52 from reaching the Ni-plated layer 18 defining the inner layer.

Since the external electrode 14 has a small width, there is a risk in that, when the linear edge portion 52 is pressed to abut against the external electrode 14 such that the linear edge portion 52 lies substantially parallel to the longitudinal direction of the external electrode 14, the inspection terminal 50 is sometimes brought out of contact with the external electrode 14 when the electronic chip component 10 moves inside the storing portion 34. However, the above described inspection apparatus 30 eliminates such a risk since the electronic chip component 10 is sucked in a predetermined direction by the sucking portion 44 so as to be positioned at a predetermined position, thereby allowing the inspection terminal 50 to be pressed to abut precisely against the external electrode 14.

As described above, by using the inspection apparatus 30, the inspection terminal 50 is pressed to abut reliably against the external electrode 14 of the electronic chip component 10, thereby allowing the edge portion 52 of the inspection terminal 50 to cut into only the outermost layer without permitting the inspection terminal 50 to come into contact with the inner layer of the external electrode 14. Consequently, the characteristic of the electronic chip component 10 can be measured reliably and accurately. It should be noted that the external electrode of the electronic component used in the present invention is not limited to the external electrode having a three-layered structure, as illustrated in preferred embodiments, and the method of forming the electrode is not restrictive.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An inspection method for inspecting an electronic chip component which has external electrodes arranged so as to cover both end surfaces of the electronic chip component, each of the external electrodes having an inspection terminal contact surface with a long side and a short side, comprising the steps of:

preparing an inspection terminal having a linear edge portion at an end thereof;

bringing the linear edge portion of the inspection terminal into a contacting state in which the linear edge portion of the inspection terminal contacts the inspection terminal contact surface of one of the external electrodes of the electronic chip component such that the linear edge portion of the inspection terminal is substantially parallel to the long side of the inspection terminal contact surface of the external electrode; and inspecting the electronic chip component in the contacting state.

2. The inspection method according to claim 1, further comprising the step of sorting the electronic chip component on the basis of the inspection result.

3. The inspection method according to claim 1, wherein the linear edge portion has an angle that is greater than approximately 90° and equal to or smaller than approximately 120°.

4. The inspection method according to claim 1, wherein the inspection terminal is substantially cylindrical including the linear edge portion.

* * * * *